United States Patent
Fisher et al.

(10) Patent No.: US 6,416,824 B2
(45) Date of Patent: Jul. 9, 2002

(54) DENSIFICATION

(75) Inventors: Ronald Fisher, Rugby; Alan Frank Tibbatts, Coventry, both of (GB)

(73) Assignee: Dunlop Aerospace (GB)

( * ) Notice: Subject to any disclaimer, the term of this patent is extended or adjusted under 35 U.S.C. 154(b) by 0 days.

(21) Appl. No.: 09/737,730

(22) Filed: Dec. 15, 2000

(30) Foreign Application Priority Data

Dec. 30, 1999 (GB) ............................................. 9930810

(51) Int. Cl.[7] ................................................. H05B 6/02
(52) U.S. Cl. ..................... 427/590; 427/237; 427/249.2; 427/249.4; 427/255.395; 427/256; 427/314; 427/591; 427/598
(58) Field of Search ................................. 427/590, 591, 427/598, 237, 249.2, 249.4, 255.395, 256, 314

(56) References Cited

U.S. PATENT DOCUMENTS

| 5,025,124 A | 6/1991 | Alfredeen |
| 5,348,774 A | 9/1994 | Golecki et al. |
| 5,652,030 A | 7/1997 | Delperier et al. |
| 5,789,026 A | 8/1998 | Delperier et al. |
| 5,846,611 A | 12/1998 | Christin |

*Primary Examiner*—Bernard Pianalto
(74) *Attorney, Agent, or Firm*—Caesar, Rivise, Bernstein, Cohen & Pokotilow, Ltd.

(57) ABSTRACT

A method of deposing a carbon-containing substance in the pores of a porous body comprises establishing an open varying magnetic field flux loop and placing the body such that a magnetic field flux generated by the open magnetic field flux loop passes through a region of said body and heats that region, creating a thermal gradient across the body and bringing a thermally decomposable carbon-containing gas into contact with the heated region, thereby depositing a carbon-containing substance in the pores if said heated region.

17 Claims, 1 Drawing Sheet

DENSIFICATION

The invention relates to densification of porous bodies. One particular instance is in the densification of porous structural components such as brake discs or pads for aircraft, which typically are made of a porous carbon body infiltrated by carbon.

Many different methods are known for the deposition of a carbon or ceramic matrix on a fibrous substrate of carbon or ceramic fibres. In a thermal gradient process the densification is started at the inside of the substrate or preform and progresses outwards until the whole article is densified. Because the exterior pores of the preform do not become blocked until the centre of the preform is densified, it is found that densification can proceed at a higher rate, reducing processing times and cost compared to the isothermal method of densification.

In all processes where a fibrous substrate is being densified the control of deposition conditions, such as temperature and pressure, is important to ensure the deposition reaction continues at the required rate in order to produce a deposit of the required structure. Where a matrix of carbon is being deposited to manufacture friction discs for aircraft brakes, it can be desirable that the deposit is a graphitisable carbon in order to heat treat the composite to maximise the thermal properties. The graphitisable form of carbon is often referred to as rough laminar and can be distinguished from the non-graphitisable smooth laminar form by microscopic examination using polarised light.

U.S. Pat. No. 5,846,611 to Christin discloses a method of Chemical Vapour Infiltration (CVI) in which a substrate, such as a needled fibrous structure, is located within a winding, the winding extending axially over a length which is equal or greater than the axial length of the substrate, such that the substrate lies entirely within the electromagnetic field generated by the winding. The frequency of the current powering the winding is selected such that surface heating of the substrate is limited due to radiation and convection of heat from the surface and a temperature gradient is established between the centre region of the substrate and the surface thereof. In order to accomplish such a temperature gradient it is taught that the ratio of the substrates radial and circumferential electrical resistivities must be above a known value whilst the ratio of radial and circumferential thermal conductivities must not be less than a known value.

Similarly, U.S. Pat. Nos. 5,789,026 and 5,652,030 both to Delperier, disclose methods of CVI in which a substrate is located within a volume defined by the winding. In U.S. Pat. No. 5,789,026 a temperature gradient is maintained throughout the substrate and carbon deposition is activated, in the substrate region at the highest temperature, by the presence of hydrogen. U.S. Pat. No. 5,652,030 teaches that the temperature at the surface of the substrate is maintained below a deposition temperature of the material to be deposited, whilst the presence of a temperature gradient ensures that a region of the substrate toward the centre thereof is above said deposition temperature.

In thermal gradient deposition, heating may also be effected by induction heating of a graphite susceptor see, e.g. Golecki U.S. Pat. No. 5,348,774 which discloses a process in which the fibrous substrate is in contact with a graphite mandrel which is heated by the electromagnetic field from an induction coil. The fibrous substrate is then heated by conduction from the graphite mandrel. The main problem with this method of establishing the thermal gradient in the preform is the requirement for a susceptor core which might only be usable once if damage is caused during removal from the densified composite.

Another method of producing a thermal gradient in a fibrous substrate for densification by CVI is described by J. J. Gebhardt et al in a paper entitled "Formation of carbon-carbon composite materials by pyrolitic infiltration", Petroleum Derived Carbons ACS Series No. 21 6/73, pages 212 to 227. In the method of Gebhardt the thermal gradient is maintained by a high rate of gas flow cooling the outer surface of the substrate and by heating only a small volume of the cylindrical substrate in the induction coil, densification of the whole being achieved by moving the substrate inside the induction coil. The substrate is manufactured from graphite fibres which have sufficient electrical conductivity to enable heating of the substrate by direct coupling with the induction coil. Practical constraints on the process make it difficult to apply on an industrial scale and it is unsuitable for other substrate geometry, such as a disc.

U.S. Pat. No. 5,025,124 (see also Materials Worlds, Journal of the Institute of Materials, August 1998, 470–471) proposes a method of heating called Uniform Magnetic Heating (UMH) in which an article to be heated is placed between the jaws of a C-core constructed of laminated material with a coil wound around each end, through which an alternating current is passed. This alternating current sets up a 'fluctuating' magnetic field in the laminate. A magnetic field flux loop flows through the laminate and passes across the gap between the jaws, i.e. open ends of the C-shaped laminate. When an article, typically a component of a material with a higher reluctance than the material of the laminated core is placed between the jaws the article becomes part of the loop and the magnetic flux creates a heating effect in the article. UMH has been used to create a uniform heating effect in articles.

The C-shaped laminate consists of a fixed rear and bottom section and an upper section that can move vertically to alter the distance between the jaws of the C-core. The use of more than one core has been proposed where greater heating power is required and/or multi-phase power supplies are available.

It is one object of the invention to provide a method for use in the densification of a porous body which is fast in use and simple to operate. The invention is based on the appreciation that the UMH method of heating can be used to focus heating in a porous preform where deposition could then be initiated to densify the composite using a thermal gradient effect. A more specific object of the invention is to provide an improved method for the densification of a porous structure, and a porous structure densified by the method of the invention and a densified structure formed by the invention.

According to the invention in one aspect there is provided a method of depositing a carbon-containing substance in the pores of a porous body, the method comprising the steps of:
establishing a varying magnetic field flux loop;
placing the porous body within the loop such that only a localised portion thereof is heated by direct exposure to the varying magnetic field flux generated by said varying magnetic field flux loop;
creating a thermal gradient across the porous body;
exposing the heated localised portion of the porous body to a thermally decomposable carbon-containing gas to deposit the carbon-containing substance in the pores of the localised portion.

According to the invention, in a further aspect, there is provided a method of depositing carbon in the pores of a porous body, the method comprising:
mounting the body in a gap defined by jaws of a frame containing a coil and defining an open magnetic field flux loop, such that a varying magnetic flux passes in a centre region of the body and induces heat therein;

locating the assembly so formed in a deposition chamber;

applying an alternating electric current to the coil to generate the magnetic field flux from said open magnetic field flux loop whereby to heat the body;

causing or allowing the passage of heat from the periphery of the body whereby to create a thermal gradient across the body;

bringing a carbon-containing gas into contact with the heated part(s) of the porous body; and continuing the supply of gas for a time period until sufficient elemental carbon has deposited in the pores of the porous body.

Preferably the support comprises a coil which contain a high magnetic permeability low reluctance laminate material. In one embodiment the coils are present at the ends of a generally C-shaped member, the mouth of which defines the gap to receive the body to be treated.

In one preferred step, the method includes the step of locating a stack of porous bodies to be densified in the gap defined by the jaws of the support.

The infiltrating gas may be of any suitable type and may be derived from a gas, e.g. methane, or from a solid or liquid. Preferably the material deposited is carbon which may be derived from a hydrocarbon gas, e.g. natural gas or methane. Other materials include silicon carbide which may be derived from e.g. methyltrichlorsilane and which will form a ceramic matrix.

The porous bodies may be used to form carbon-carbon composite brake discs of the type used in aircraft disc brake assembly. Such bodies include fibrous preforms, partially densified composites; and the like.

One or more different techniques may be used to create a thermal gradient across the body, typically from the centre to the periphery. Such techniques include:

passing gas about the body so as to cool selected portions;

incorporating fibres of selected thermal conductivity in selected zones of the body;

externally cooling the carbon deposition chamber, e.g. water cooling or otherwise cooling the body itself.

When the carbon-containing substance, such as a carbon-containing gas comes into contact with heated areas of the porous body the gas is cracked to deposit carbon. The level of heating of the body and the slope of the gradient will be determined in known manner.

One preferred method includes mounting a number of the frames about the body (or stack of bodies) to concentrate the heat generation in selected areas.

A further aspect of the invention resides in a method of forming a densified structure comprising the steps of;

establishing a varying magnetic field flux loop;

placing a porous body within the loop such that only a localised portion thereof is heated by direct exposure to a varying magnetic field flux generated by the magnetic field flux loop;

exposing the body to a decomposable carbon-containing gas; and propagating a deposition front through the body to deposit a carbon-containing substance in the pores of the porous body.

In order that the invention may be well understood it will now be described by way of example only with reference to the accompanying diagrammatic drawings, in which:

Figure 1:
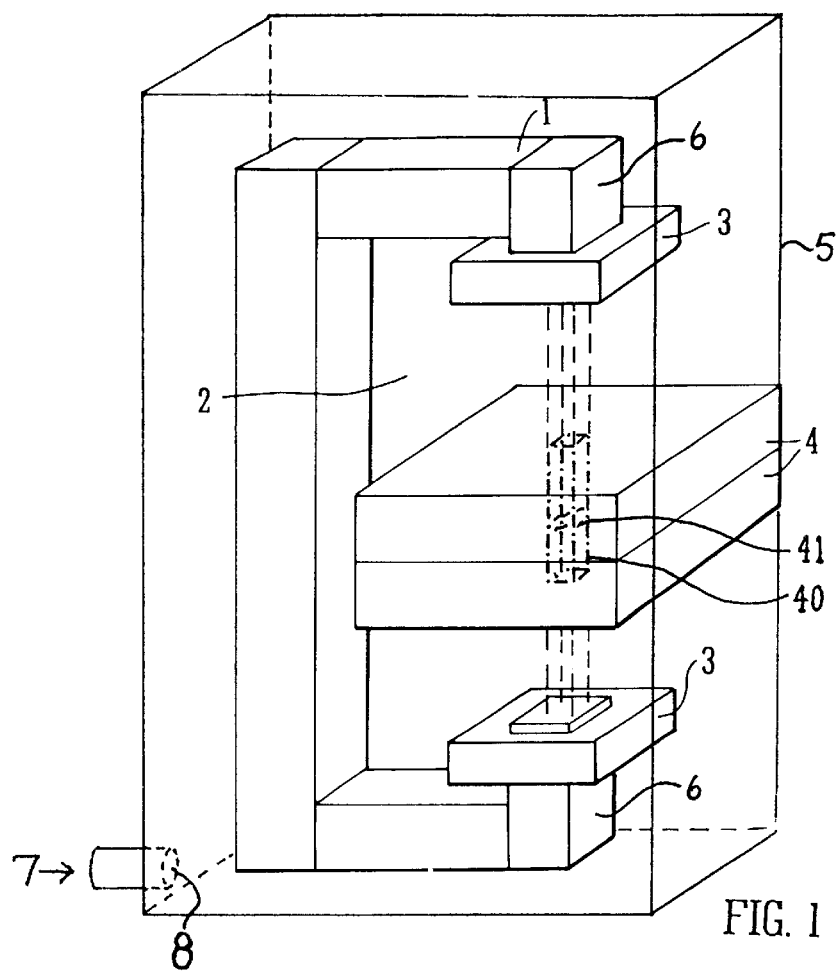
FIG. 1 is a perspective view of one assembly of the invention

The heating apparatus shown in FIG. 1 comprises a generally C shaped frame 1, having an open mouth 2 between the jaws 6 at the free ends. The apparatus comprises a laminated assembly of generally parallel metal strips formed into a magnetic loop and separated by insulating layers. A coil 3 is wound about each end of the core. As shown they are generally square blocks but can be of any suitable shape, so long as the magnetic flux loop lines will pass from one to the other via a workpiece in the mouth 2. The distance between the coils 3 may be varied both vertically and horizontally.

A stack of porous carbon bodies 4 is located between the coils 3, two are shown.

The apparatus is connected to an AC supply, not shown. When the alternating current is applied a magnetic field flux is created in the coils 3 and flows between them via the stack as shown by the dotted lines. Heat is generated quickly and spreads from the inside of the bodies 4 to their periphery, the heat being focussed in a localised region 40 by virtue of the interaction of the magnetic field with the body 4. To create the thermal gradient for carbon vapour infiltration, a cooling gas 7 may be passed by the stack. When a carbon containing gas 7 contacts the heated body 4 the gas 7 will be cracked and carbon will be deposited in the pores in graphitisable form. For this the assembly is, or just the preform porous bodies 4 are, located in a suitable carbon deposition chamber 5 provided with a gas inlet port 8. Carbon-containing gas 7 is introduced via inlet port 8 and heated by contact with the heated porous bodies 4 to cause infiltration of carbon into the porous body 4.

Additionally or alternatively, fibres 41 of high thermal conductivity may be incorporated within the bodies 4, such fibres facilitating the flow of heat within the bodies 4.

As previously stated, the temperature gradient across the bodies 4 is a consequence of the centre region thereof 40 at commencement of the process, being maintained at a higher temperature than the cooled periphery. The current in the coils is controlled such that the temperature at the centre region of the bodies 4 reaches the deposition temperature and carbon is deposited in the pores of that region after subjection of the bodies 4 to the carbon-containing gas 7. As carbon is deposited the thermal conductivity of the densified region increases thereby increasing the heat flow toward the periphery of the bodies 4.

The increase in heat flow through the bodies 4, from the centre region 40 to the periphery, causes those regions toward the periphery to reach the necessary temperature for carbon deposition. In essence, a so-called "deposition front" propagates through the volume defined by the discs, ensuring carbon deposition throughout the bodies 4 and consequent densification thereof.

The method is quick, simple and reliable.

Figure 2:
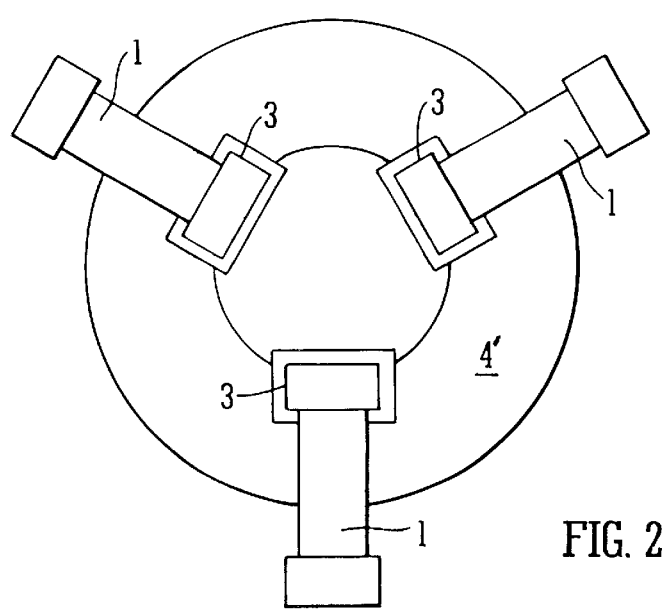
FIG. 2 is a top plan view of another assembly of the invention.

In the embodiment of FIG. 2 three C shaped frames are used for 3 phase heating and/or to heat selected areas only of a disc 4' or stack of discs 4'.

The invention is not limited to the embodiment shown. For example, the porous body may have an aperture; it may be partially densified; the article need not be a brake disc or pad.

What is claimed is:

1. A method of depositing a carbon-containing substance in the pores of a porous body, the method comprising the steps of:
   establishing a varying magnetic field flux loop;
   placing the porous body within the loop such that only a localised portion thereof is heated by direct exposure to the varying magnetic field flux generated by said varying magnetic field flux loop;
   creating a thermal gradient across the porous body;
   exposing the heated localised portion of the porous body to a thermally decomposable carbon-containing gas to deposit the carbon-containing substance in the pores of the localised portion.

2. A method according to claim 1, including passing gas about the porous body to cool selected surface portions thereof and thereby create the thermal gradient across the porous body.

3. A method according to claim 1, comprising establishing the varying magnetic field flux loop at least partially within a frame provided with a pair of jaws.

4. A method according to claim 3, including the step of locating a stack of porous bodies in a gap defined by the jaws of the frame.

5. A method according to claim 1, including incorporating thermally conductive fibres in a selected zone or zones of the body to create the thermal gradient across the porous body.

6. A method according to claim 1, wherein the thermally decomposable carbon-containing gas is a hydrocarbon.

7. A method according to claim 1, wherein the thermally decomposable carbon-containing gas is methyltrichlorosilane to form a ceramic matrix comprising silicon carbide.

8. A method of depositing carbon in the pores of a porous body, the method comprising:
   mounting the body in a gap defined by jaws of a frame containing a coil and defining an open magnetic field flux loop, such that a varying magnetic flux passes in a centre region of the body and induces heat therein;
   locating the assembly so formed in a deposition chamber;
   applying an alternating electric current to the coil to generate the magnetic field flux from said open magnetic field flux loop whereby to heat the body;
   causing or allowing the passage of heat from the periphery of the body whereby to create a thermal gradient across the body;
   bringing a carbon-containing gas into contact with the heated part(s) of the porous body; and
   continuing the supply of gas for a time period until sufficient elemental carbon has deposited in the pores of the porous body.

9. A method according to claim 8, including the step of locating a stack of porous bodies in the gap defined by the jaws of the frame.

10. A method according to claim 8, including passing gas about the body so as to cool selected portions to create a thermal gradient across the porous body.

11. A method according to claim 8, including incorporating fibres of selected thermal conductivity in selected zones of the body to create a thermal gradient across the porous body.

12. A method according to claim 8, including externally cooling the deposition chamber to create a thermal gradient across the porous body.

13. A method according to claim 8, including mounting a plurality of frames about the body to concentrate the heat generation in selected areas of the body.

14. A method according to claim 8, including mounting a plurality of frames about a stack of porous bodies to concentrate the heat generation in selected areas of the stack of porous bodies.

15. A method according to claim 8, wherein the thermally decomposable carbon-containing gas is a hydrocarbon.

16. A method according to claim 8, wherein the thermally decomposable carbon-containing gas is methyltrichlorosilane to form a ceramic matrix comprising silicon carbide.

17. A method of forming a densified structure comprising the steps of;
   establishing a varying magnetic field flux loop;
   placing a porous body within the loop such that only a localised portion thereof is heated by direct exposure to a varying magnetic field flux generated by the magnetic field flux loop;
   exposing the body to a decomposable carbon-containing gas; and
   propagating a deposition front through the body to deposit a carbon-containing substance in the pores of the porous body.

* * * * *